United States Patent
Kim et al.

(10) Patent No.: US 8,405,185 B2
(45) Date of Patent: Mar. 26, 2013

(54) SEMICONDUCTOR DEVICE AND SEMICONDUCTOR MODULE INCLUDING THE SAME

(75) Inventors: Bong-Soo Kim, Seongnam-si (KR); Kwang-Youl Chun, Seoul (KR); Sang-Bin Ahn, Incheon (KR)

(73) Assignee: Samsung Electronics, Co., Ltd. (KR)

( * ) Notice: Subject to any disclaimer, the term of this patent is extended or adjusted under 35 U.S.C. 154(b) by 182 days.

(21) Appl. No.: 12/944,876

(22) Filed: Nov. 12, 2010

(65) Prior Publication Data

US 2011/0175229 A1 Jul. 21, 2011

(30) Foreign Application Priority Data

Jan. 18, 2010 (KR) .................. 10-2010-0004438

(51) Int. Cl.
*H01L 29/00* (2006.01)

(52) U.S. Cl. . 257/503; 257/654; 257/774; 257/E21.027; 257/E21.058; 257/E21.166; 257/E21.215; 257/E21.216; 257/E21.231; 257/E21.499; 257/E21.577; 257/E21.585; 257/E21.59

(58) Field of Classification Search ............. 257/334, 257/503, 504, 505, 509, 510, 654, 774, E21.027, 257/E21.068, E21.166, E21.215, E21.216, 257/E21.231, E21.499, E21.577, E21.585, 257/E21.59

See application file for complete search history.

(56) References Cited

U.S. PATENT DOCUMENTS 6,465,331 B1 * 10/2002 Keeth et al. .................. 438/479
7,851,321 B2 * 12/2010 Clevenger et al. ............ 438/381
2007/0284647 A1 12/2007 Seo et al.
2008/0284029 A1 * 11/2008 Kim et al. ..................... 257/758

FOREIGN PATENT DOCUMENTS

| JP | 2003-023104 | 1/2003 |
| KR | 100714900 B1 | 4/2007 |
| KR | 100843715 B1 | 6/2008 |

* cited by examiner

*Primary Examiner* — David Nhu
(74) *Attorney, Agent, or Firm* — Myers Bigel Sibley & Sajovec, P.A.

(57) ABSTRACT

Integrated circuit devices include a semiconductor substrate having a plurality of trench isolation regions therein that define respective semiconductor active regions therebetween. A trench is provided in the semiconductor substrate. The trench has first and second opposing sidewalls that define opposing interfaces with a first trench isolation region and a first active region, respectively. A first electrical interconnect is provided at a bottom of the trench. An electrically insulating capping pattern is provided, which extends between the first electrical interconnect and a top of the trench. An interconnect insulating layer is also provided, which lines the first and second sidewalls and bottom of the trench. The interconnect insulating layer extends between the first electrical interconnect and the first active region. A recess is provided in the first active region. The recess has a sidewall that defines an interface with the interconnect insulating layer. A second electrical interconnect is also provided, which extends on: (i) an upper surface of the first trench isolation region, (ii) the electrically insulating capping pattern; and (iii) the sidewall of the recess. The first and second electrical interconnects extend across the semiconductor substrate in first and second orthogonal directions, respectively.

20 Claims, 15 Drawing Sheets

SEMICONDUCTOR DEVICE AND SEMICONDUCTOR MODULE INCLUDING THE SAME

REFERENCE TO PRIORITY APPLICATION

This application claims priority to Korean Patent Application No. 10-2010-0004438, filed Jan. 18, 2010, the contents of which are hereby incorporated herein by reference.

FIELD

The present invention relates to integrated circuit devices and methods of forming same and, more particularly, to integrated circuit devices having electrical interconnects therein.

BACKGROUND

Generally, a semiconductor device is fabricated by disposing interconnections and a plug on a semiconductor substrate. The plug may be disposed between the interconnections, and thus can be in contact with the semiconductor substrate. In this case, the plug may be formed on the semiconductor substrate to be electrically insulated from the interconnections. However, in the semiconductor device, a distance between the interconnections may gradually decrease according to a decrease in design rules. In the semiconductor device, a distance between the interconnections and the plug may also gradually decrease according to the decrease in the design rule.

The plug may have a high probability of being in contact with the interconnections through the decrease in the design rule of the semiconductor device. To reduce the probability of the contact between the plug and the interconnections, the interconnections may have a complicated configuration on the periphery of the plug. Due to the complicated configuration of the interconnections, the interconnections may have a poor process margin with the plug during performance of a semiconductor fabrication process. Accordingly, the plug and the interconnections may degrade electrical characteristics of the semiconductor device.

The semiconductor device may be installed in a semiconductor module and/or a processor-based system. The semiconductor module and/or the processor-based system may have a poor electrical characteristic due to the semiconductor device.

SUMMARY

Integrated circuit devices according to some embodiments of the invention include a semiconductor substrate having a plurality of trench isolation regions therein that define respective semiconductor active regions therebetween. A trench is provided in the semiconductor substrate. The trench has first and second opposing sidewalls that define opposing interfaces with a first trench isolation region and a first active region, respectively. A first electrical interconnect is provided at a bottom of the trench. An electrically insulating capping pattern is provided, which extends between the first electrical interconnect and a top of the trench. An interconnect insulating layer is also provided, which lines the first and second sidewalls and bottom of the trench. The interconnect insulating layer extends between the first electrical interconnect and the first active region. A recess is provided in the first active region. The recess has a sidewall that defines an interface with the interconnect insulating layer. A second electrical interconnect is also provided, which extends on: (i) an upper surface of the first trench isolation region, (ii) the electrically insulating capping pattern; and (iii) the sidewall of the recess. According to these embodiments of the invention, the first and second electrical interconnects extend across the semiconductor substrate in first and second directions, respectively. These first and second directions can be orthogonal to each other.

According to additional embodiments of the invention, an integrated circuit device is provided that includes a semiconductor substrate having an active region therein. First and second trench isolation regions are provided on opposing sides of the active region. A recess is provided, which extends into the active region and into the first and second trench isolation regions. A first electrical interconnect is provided on a bottom of the recess. The first electrical interconnect extends lengthwise in a first direction between the first and second trench isolation regions. A second electrical interconnect structure is also provided, which extends underneath the first electrical interconnect. The second electrical interconnect structure includes a trench, which extends lengthwise through the first and second trench isolation regions in a second direction orthogonal to the first direction, and a second electrical interconnect at a bottom of the trench. According to additional embodiments of the invention, the second electrical interconnect structure includes an electrically insulating capping pattern, which extends between the second electrical interconnect and the first electrical interconnect. An interconnect insulating layer is also provided, which lines a bottom and sidewalls of the trench.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF EXAMPLE EMBODIMENTS

Figure 1:
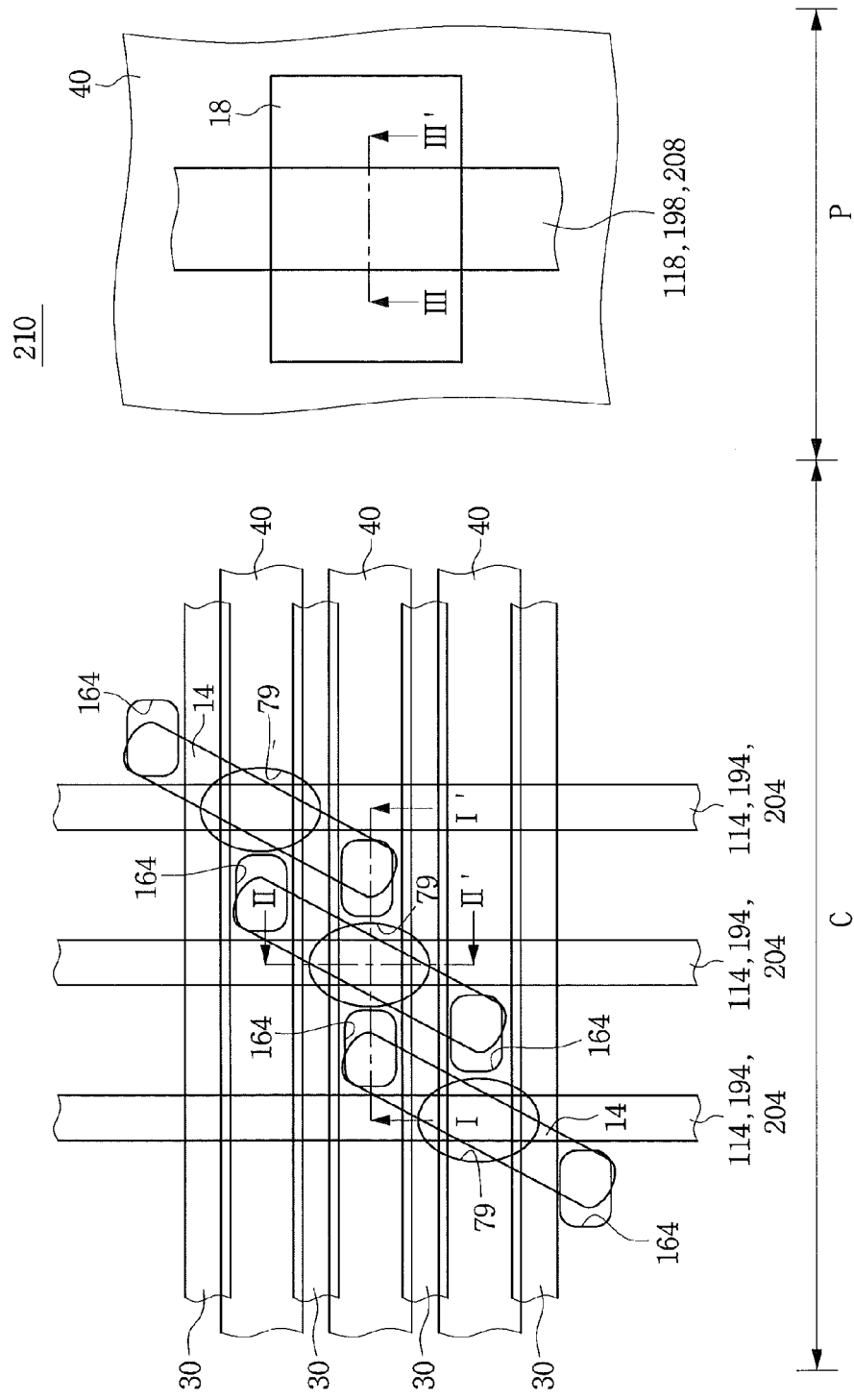
FIG. 1 is a plan view showing a semiconductor device according to example embodiments.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

A semiconductor device according to example embodiments will be described in further detail with reference to FIGS. 1 and 2. FIG. 1 is a plan view showing a semiconductor device according to example embodiments. Referring to FIG. 1, a semiconductor device 210 according to example embodiments may include cell active regions 14 in a cell array region C. In central regions of the cell active regions 14, concaves 79 or recessed regions 79 may be disposed. The concaves 79 may partially or completely overlap the cell active regions 14. First circuit interconnections 30 crossing the cell active regions 14 may be disposed. Two selected first circuit interconnections 30 may overlap one selected cell active region 14.

The first circuit interconnections 30 may partially overlap edges of the concaves 79. The concaves 79 may be located between the first circuit interconnections 30. Second circuit interconnections 114, 194 or 204 crossing the first circuit interconnections 30 may be disposed. One of the second circuit interconnections 114, 194 or 204 may overlap the one selected cell active region 14. The second circuit interconnections 114, 194 or 204 may cross cell active regions 14 in the central regions of the concaves 79.

The second circuit interconnections 114, 194 or 204 may cross the cell active regions 14 and the first circuit interconnections 30 at the edges of the concaves 79. Through holes 164 may be disposed at edges of the cell active regions 14. The through holes 164 may be located between the first circuit interconnections 30 and the second circuit interconnections 114, 194 or 204. The through holes 164 may be located on the periphery of the concaves 79. Meanwhile, the semiconductor device 210 may further include at least one peripheral active region 18 in a peripheral circuit region P. The peripheral circuit region P may be disposed on the periphery of the cell array region C of the semiconductor device 210. Third circuit interconnections 118, 198 or 208 may be disposed on the at least one peripheral active region 18.

Figure 2:
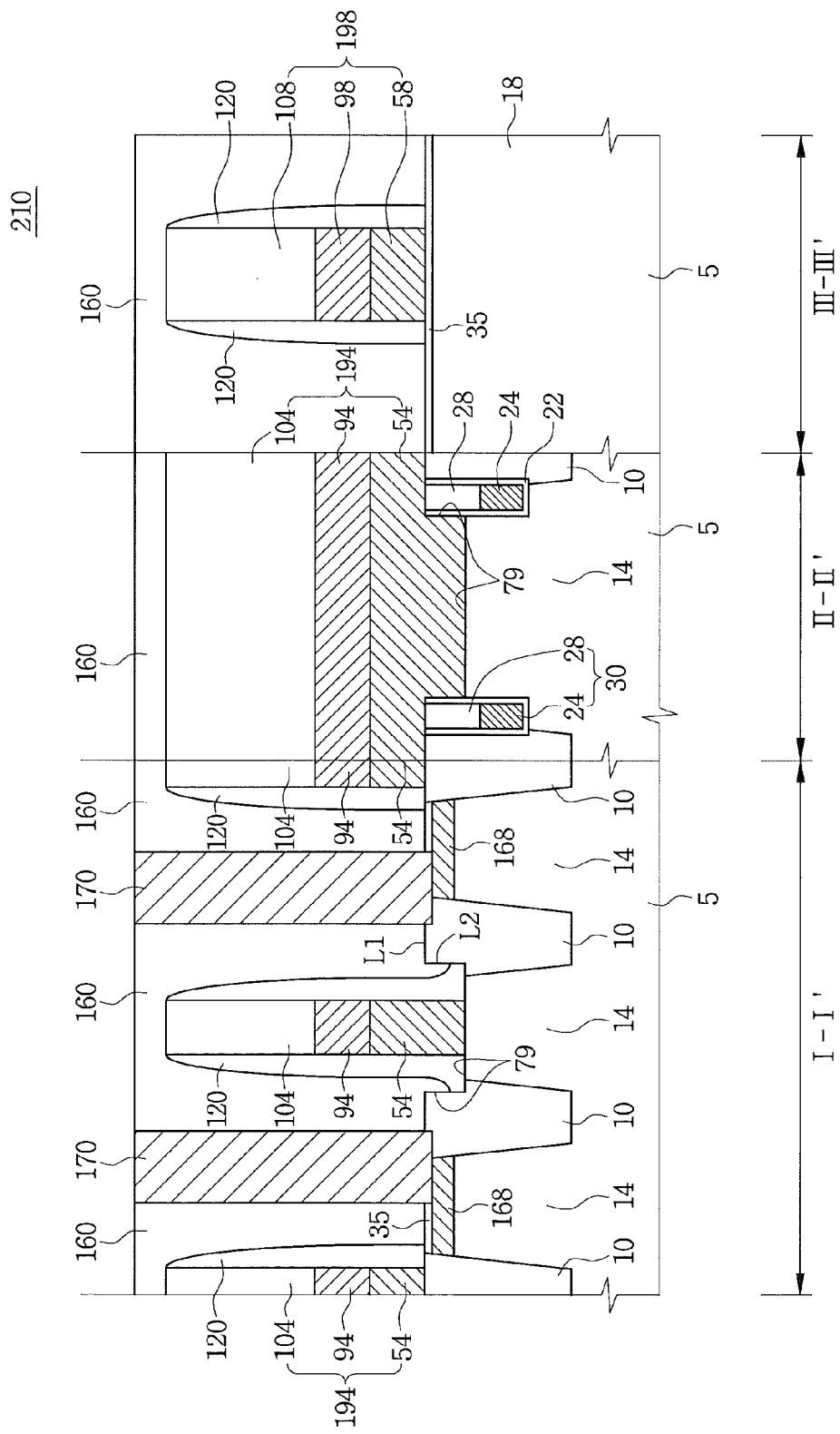
FIG. 2 is a cross-sectional view showing the semiconductor device taken along lines I-I', II-II', and III-III' of FIG. 1.

FIG. 2 is a cross-sectional view showing a semiconductor device taken along lines I-I', II-II', and III-III' of FIG. 1. Referring to FIG. 2, a semiconductor device 210 according to example embodiments may include a semiconductor substrate 5 divided into the cell array region C and the peripheral circuit region P of FIG. 1. The semiconductor substrate 5 may include cell active regions 14 in a cell array region C. The cell active regions 14 may be defined by an inactive region 10. Concaves 79 may be located in the inactive region 10 and the cell active regions 14. The concaves 79 may be disposed in the central regions of the cell active regions 14, and the inactive region 10 on the periphery of the cell active regions 14. The concaves 79 may also be disposed only in the cell active regions 14.

In the cell array region C, the concaves 79 may extend from top surfaces of the inactive region 10 and the cell active regions 14 to a lower portion of the semiconductor substrate 5. The first circuit interconnections 30 may be disposed in the inactive region 10 and the cell active regions 14. Each of the first circuit interconnection 30 may include an interconnection 24 and a capping pattern 28, which are sequentially stacked. The first circuit interconnections 30 may be partially exposed to the concaves 79. In this case, bottom surfaces of the concaves 79 may be located between top and bottom surfaces of the first circuit interconnections 30.

To be more specific, the bottom surfaces of the concaves 79 may be located between the top and bottom surfaces of the capping patterns 28. The first circuit interconnections 30 may be disposed between the concaves 79 and the inactive region 10. At the edges of the concaves 79, the first circuit interconnections 30 may horizontally extend from the inactive region 10 to the cell active regions 14. In the cell array region C, second circuit interconnections 194 may be disposed on the inactive region 10 and the cell active regions 14. The second circuit interconnections 194 may be disposed perpendicular to the first circuit interconnections 30.

In this case, the second circuit interconnections 194 may cross the concaves 79 and extend to the inactive region 10. Each of the second circuit interconnection 194 may include a second cell conductive pattern 54, a fourth conductive pattern 94, and a cell mask pattern 104, which are sequentially stacked. A width of the second circuit interconnection 194 may be smaller than that of the concave 79 according to a length direction of the first circuit interconnection 30, as shown in FIG. 2. The peripheral circuit region P may have at least one peripheral active region 18.

The at least one peripheral active region 18 may be defined by the inactive region 10 in the same manner as the cell active region 14. Third circuit interconnections 198 may be disposed on the inactive region 10 and the at least one peripheral active region 18. Each of the third circuit interconnection 198 may include a second peripheral conductive pattern 58, a fourth peripheral conductive pattern 98, and a peripheral mask pattern 108, which are sequentially stacked. In the cell array region C and the peripheral circuit region P, sidewall spacers 120 may be disposed on sidewalls of the second and third circuit interconnections 194 and 198.

The sidewall spacers 120 may partially or completely fill the concave 79 in the cell array region C. In this case, the sidewall spacers 120 may partially or completely cover the sidewalls of the concaves 79 without exposing the bottom surfaces of the concaves 79. An interlayer insulating layer 160 may be disposed on the first, second, and third circuit interconnections 30, 194, and 198, and the sidewall spacers 120. The interlayer insulating layer 160 may cover the inactive regions 10, the cell active regions 14, and the at least one peripheral active region 18 in the cell array region C and the peripheral circuit region P.

In the cell array region C, plugs 170 may be disposed in the interlayer insulating layer 160. The plugs 170 may pass through the interlayer insulating layer 160. The plugs 170 may be located between the second circuit interconnections 194. Thus, a contact probability between the plugs 170 and the second circuit interconnections 194 may be reduced due to the concaves 79 and the sidewall spacers 120. This is because the concaves 79 provide a step difference between the second circuit interconnections 194 and the plugs 170, which provides longer distances (L1+L2) between the second circuit interconnections 194 and the plugs 170 than in the conventional art.

The sidewall spacers 120 may be located on the concaves 79 and the second circuit interconnections 194, and thus may avoid a risk of electrical contact between the plugs 170 and the second circuit interconnections 194. In the cell array region C and the peripheral circuit region P, a pad layer 35 may be disposed on the periphery of the plugs 170 and under the third circuit interconnection 198. In this case, the pad layer 35 in the cell array region C may surround lower portions of the plugs 170. In the cell array region C, impurity diffusion regions 168 may be disposed under the pad layer 35. The impurity diffusion regions 168 may be in contact with the lower portions of the plugs 170. In the cell array region C, interconnection insulating layers 22 may be disposed in the semiconductor substrate 5 to cover the first circuit interconnections 30. Thus, as described with respect to FIGS. 1-2, embodiments of the invention include a semiconductor substrate 5 having a plurality of trench isolation regions 10 therein that define respective semiconductor active regions 14 therebetween. A trench is provided in the semiconductor substrate. (See, e.g., region II-II' in FIG. 2). The trench has first and second opposing sidewalls that define opposing interfaces with a first trench isolation region 10 and a first active region 14, respectively. A first electrical interconnect 24 is provided at a bottom of the trench. An electrically insulating capping pattern 28 is provided, which extends between the first electrical interconnect 24 and a top of the trench. An interconnect insulating layer 22 is also provided, which lines the first and second sidewalls and bottom of the trench. The interconnect insulating layer 22 extends between the first electrical interconnect 24 and the first active region 14. A recess 79 is provided in the first active region 14. The recess 79 has a sidewall that defines an interface with the interconnect insulating layer 22. A second electrical interconnect 194 is also provided, which extends on: (i) an upper surface of the first trench isolation region 10, (ii) the electrically insulating capping pattern 28; and (iii) the sidewall of the recess 79. According to these embodiments of the invention, the first and second electrical interconnects extend across the semiconductor substrate in first and second directions, respectively. These first and second directions can be orthogonal to each other.

According to additional embodiments of the invention illustrated by FIGS. 1-2, the second electrical interconnect 194 fills the recess 79. The trench exposes the first trench isolation region 10 and the first active region 14. A bottom surface of the trench is a higher level than that of the recess 79.

Figure 3:
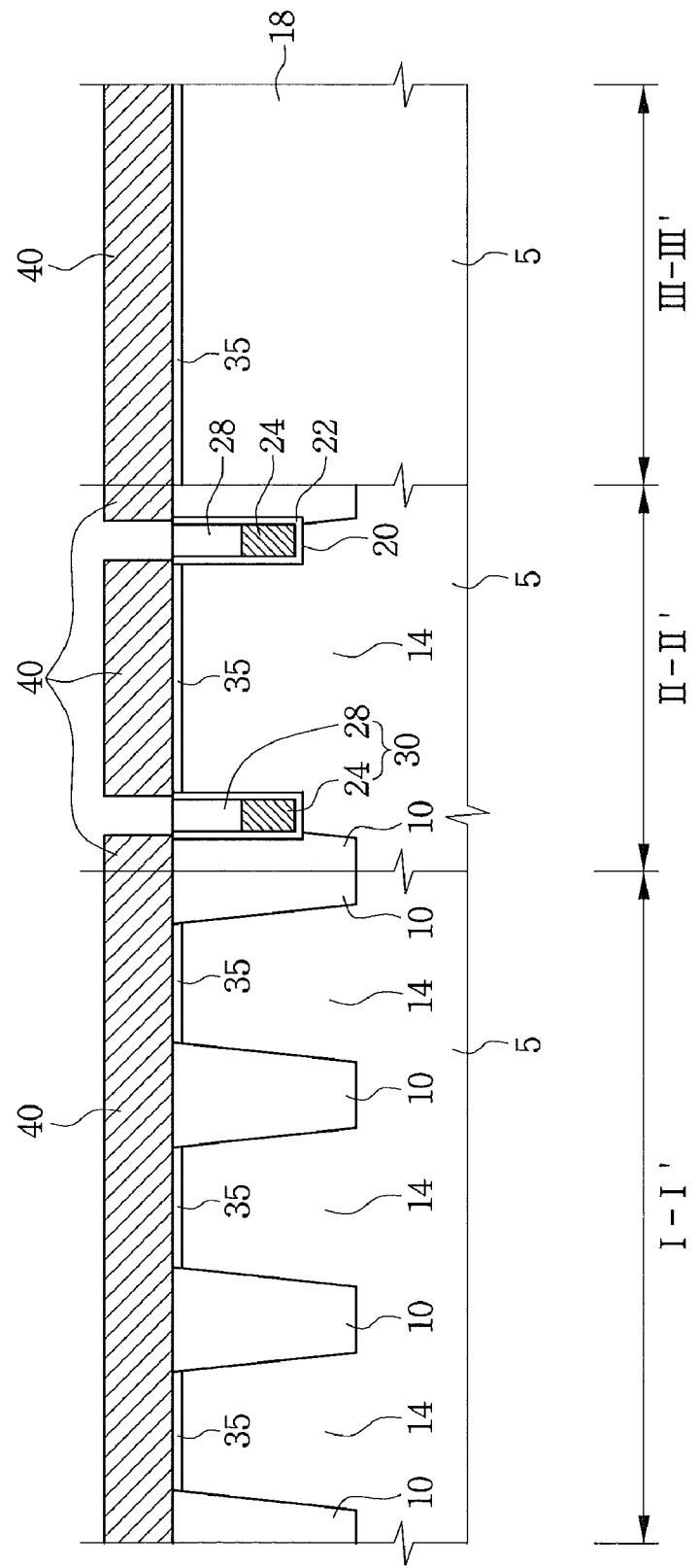
FIGS. 3 to 9 are cross-sectional views illustrating a method of fabricating a semiconductor device taken along lines I-I', II-II', and III-III' of FIG. 1.

FIGS. 3 through 9 are cross-sectional views illustrating a method of fabricating a semiconductor device taken along lines I-I', II-II', and III-III' of FIG. 1. Referring to FIG. 3, a semiconductor substrate 5 may be prepared according to example embodiments. The semiconductor substrate 5 may have a cell array region C and a peripheral circuit region P as shown in FIG. 1. An inactive region 10 may be formed in the cell array region C and the peripheral circuit region P. The inactive region 10 may define cell active regions 14 and at least one peripheral active region 18. The inactive region 10 may be filled with an isolation layer. The isolation layer may include at least one insulating material having an etch rate equal to or different from the semiconductor substrate 5.

Trenches 20 may be formed in the cell array region C. The trenches 20 may horizontally be formed in the inactive region 10 and the cell active regions 14 along first circuit interconnections 30 of FIG. 1. The trenches 20 may vertically extend from top surfaces of the inactive region 10 and the cell active regions 14 to a lower portion of the semiconductor substrate 5. Interconnection insulating layers 22 may be formed in the trenches 20. The interconnection insulating layers 22 may be formed of an insulating material having an etch rate equal to or different from the isolation layer in the inactive region 10. Interconnections 24 may be formed in lower portions of the trenches 20.

The interconnections 24 may be formed of a conductive material having an etch rate equal to or different from the interconnection insulating layer 22. Capping patterns 28 may be formed on the interconnections 24. The interconnections 24 and the capping patterns 28 may be located on the interconnection insulating layers 22 to fill the trenches 20. The interconnections 24 and the capping patterns 28 may constitute first circuit interconnections 30. Top surfaces of the first circuit interconnections 30 may be located at substantially the same level as top surfaces of the inactive region 10 and/or the cell active region 14. The first circuit interconnections 30 may include a gate pattern or a bit line pattern.

A pad layer 35 may be formed in the cell active regions 14. The pad layer 35 may be formed of an insulating material having an etch rate equal to or different from the isolation layer. The pad layer 35 may be formed of an insulating material having an etch rate equal to or different from the capping patterns 28. First preliminary conductive patterns 40 may be formed on the pad layer 35. A portion of the first preliminary conductive patterns 40 may be located between the first circuit interconnections 30 in the cell array region C as shown in FIG. 1. The portion of the first preliminary conductive patterns 40 may cross over the inactive region 10 and the cell active regions 14.

The rest of the first preliminary conductive patterns 40 may cover the inactive region 10 and at least one peripheral active region 18 in the peripheral circuit region P. The first preliminary conductive patterns 40 may be formed of the same material as or a different material from the interconnections 24 in the first circuit interconnections 30. The first preliminary conductive patterns 40 may expose the capping patterns 28 of the first circuit interconnections 30 in the cell array region C. When the first preliminary conductive patterns 40 are formed of polysilicon, the polysilicon of the first preliminary conductive patterns 40 may or may not include impurities.

Figure 4:
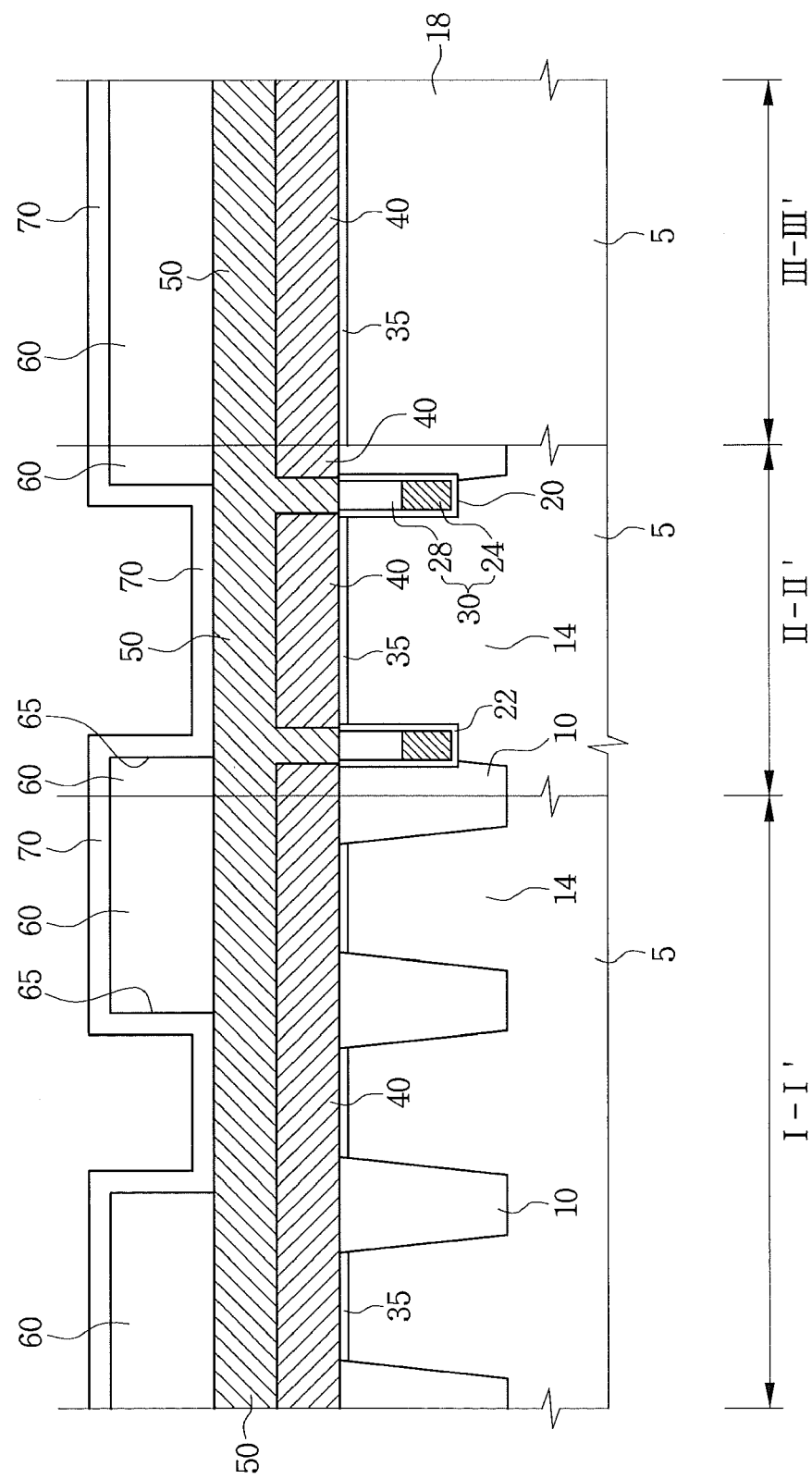

Referring to FIG. 4, according to example embodiments, a second conductive layer 50 may be formed in the cell array region C and the peripheral circuit region P. The second conductive layer 50 may be located on the first preliminary conductive patterns 40 in the cell array region C and the peripheral circuit region P. The second conductive layer 50 may cover the capping patterns 28 in the cell array region C. The second conductive layer 50 may be formed of a conductive material having an etch rate equal to or different from the first preliminary conductive patterns 40. When the second conductive layer 50 is formed of polysilicon, the second conductive layer 50 may have an impurity concentration equal to or different from the first preliminary conductive patterns 40. A first insulating layer 60 may be formed in the cell array region C and the peripheral circuit region P. The first insulating layer 60 may cover the second conductive layer 50. The first insulating layer 60 may be formed of an insulating material having an etch rate equal to or different from the second conductive layer 50. Openings 65 may be formed in the first insulating layer 60.

The openings 65 may overlap the inactive region 10 and the cell active regions 14 in the cell array region C. The openings 65 may also overlap only the cell active regions 14 in the cell array region C. A second insulating layer 70 may be formed in the cell array region C and the peripheral circuit region P. The second insulating layer 70 may be located on the first insulating layer 60 in the cell array region C and conformally cover the openings 65. The second insulating layer 70 may be formed of an insulating material having an etch rate equal to or different from the first insulating layer 60. The second insulating layer 70 may be formed of an insulating material having an etch rate equal to or different from the second conductive layer 50.

Figure 5:
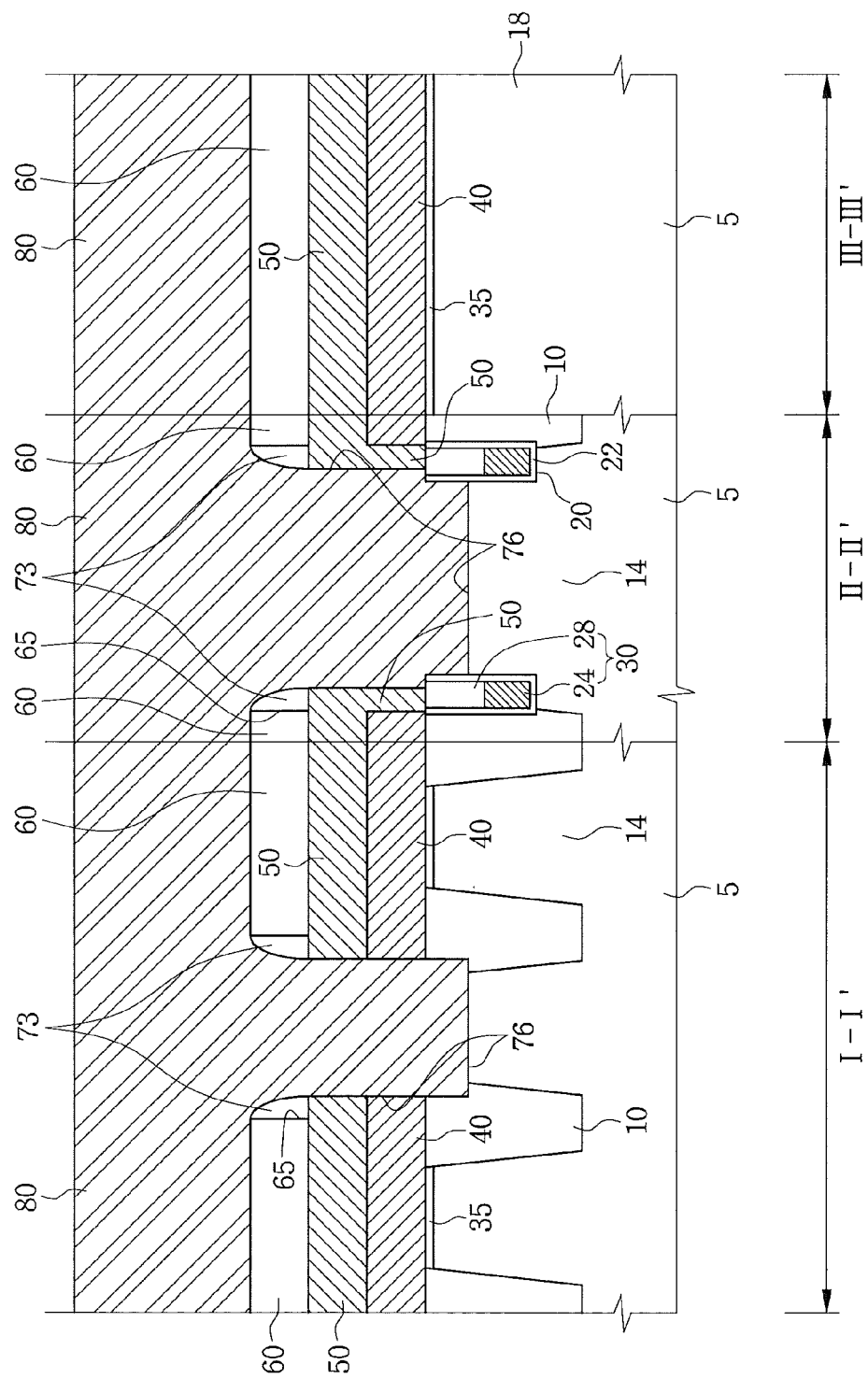

Referring to FIG. 5, according to example embodiments, the second insulating layer 70 may be etched to expose the first insulating layer 60 in the cell array region C and the peripheral circuit region P. The second insulating layer 70 may be formed into alignment patterns 73 formed on sidewalls of the openings 65 in the cell array region C. The first insulating layer 60 may be partially etched. The inactive region 10, the cell active regions 14, the first preliminary conductive patterns 40, and the second conductive layer 50 may be etched through the openings 65 using the first insulating layer 60 and the alignment patterns 73 as an etch mask.

In this case, the inactive region 10, the cell active regions 14, the first preliminary conductive patterns 40, and the second conductive layer 50 may have contact holes 76. The contact holes 76 may correspond to the concaves 79 of FIG. 1, respectively. Bottom surfaces of the contact holes 76 may be located between top and bottom surfaces of the first circuit interconnections 30. Thus, each of the contact hole 76 may partially expose two first circuit interconnections 30 in the selected cell active region 14.

The contact holes 76 may expose the first preliminary conductive patterns 40 and the second conductive layer 50. A third conductive layer 80 may be formed in the cell array region C and the peripheral circuit region P. The third conductive layer 80 may fill the contact holes 76 and cover the first insulating layer 60 and the alignment patterns 73 in the cell array region C. The third conductive layer 80 may be formed of a conductive material having an etch rate equal to or different from the second conductive layer 50.

Figure 6:
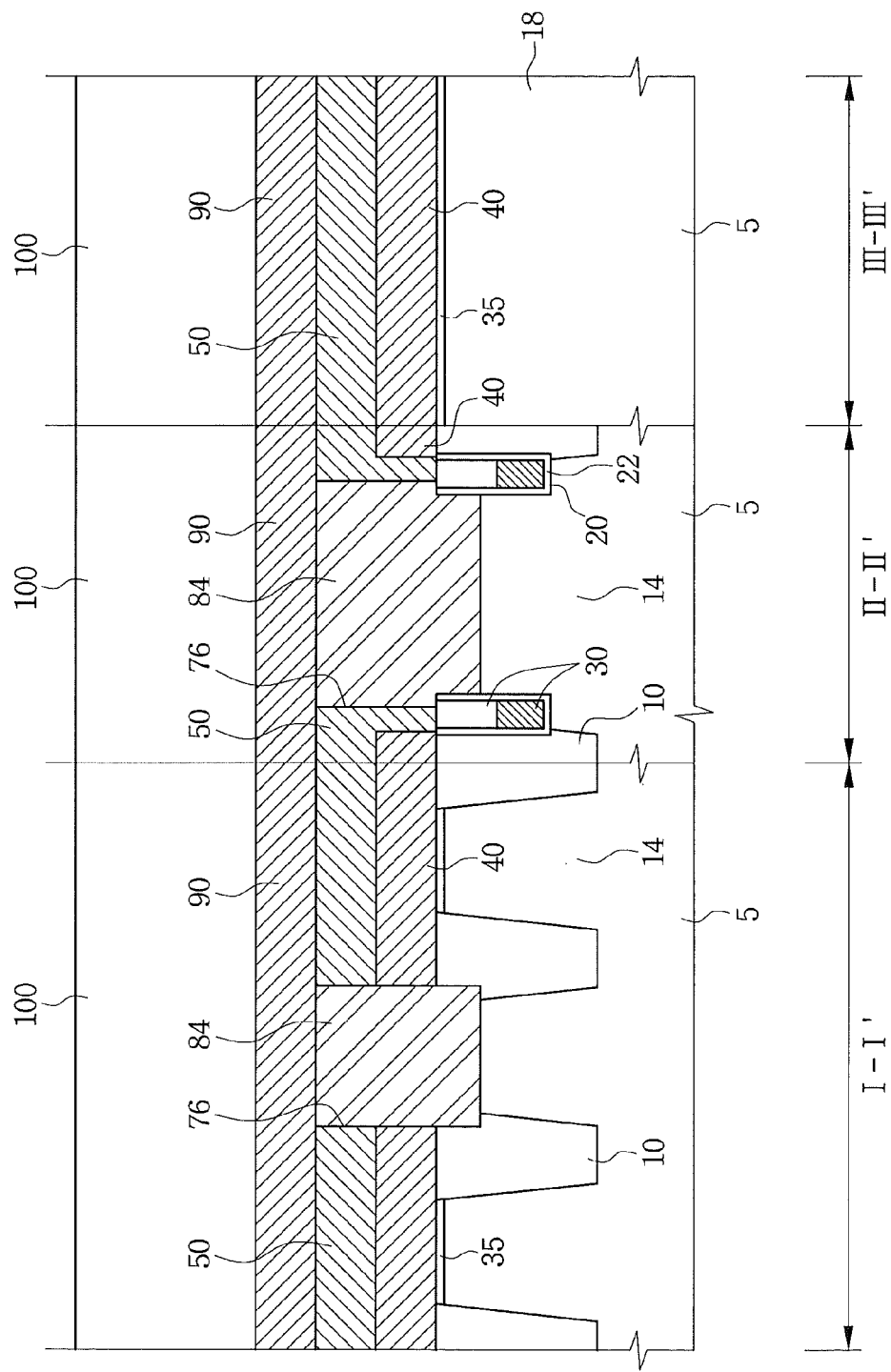

Referring to FIG. 6, according to example embodiments, the third conductive layer 80 may be etched to expose the first insulating layer 60 and the alignment patterns 73 in the cell array region C and the peripheral circuit region P. The third conductive layer 80 may be formed into third preliminary conductive patterns 84 of the contact holes 76 in the cell array region C. A top surface of the third preliminary conductive pattern 84 may be located at substantially the same level as a top surface of the second conductive layer 50. After the formation of third preliminary conductive patterns 84, the first insulating layer 60 and the alignment patterns 73 may be removed from the second conductive layer 50.

A fourth conductive layer 90 and a third insulating layer 100 may be sequentially formed in the cell array region C and the peripheral circuit region P. The fourth conductive layer 90 may be formed of a conductive material having an etch rate equal to or different from the second conductive layer 50 and/or third preliminary conductive patterns 84. The third insulating layer 100 may be formed of an insulating material having an etch rate equal to or different from the first insulating layer 60 and/or second insulating layer 70. The third insulating layer 100 may be formed of an insulating material having an etch rate equal to or different from the fourth conductive layer 90.

Figure 7:
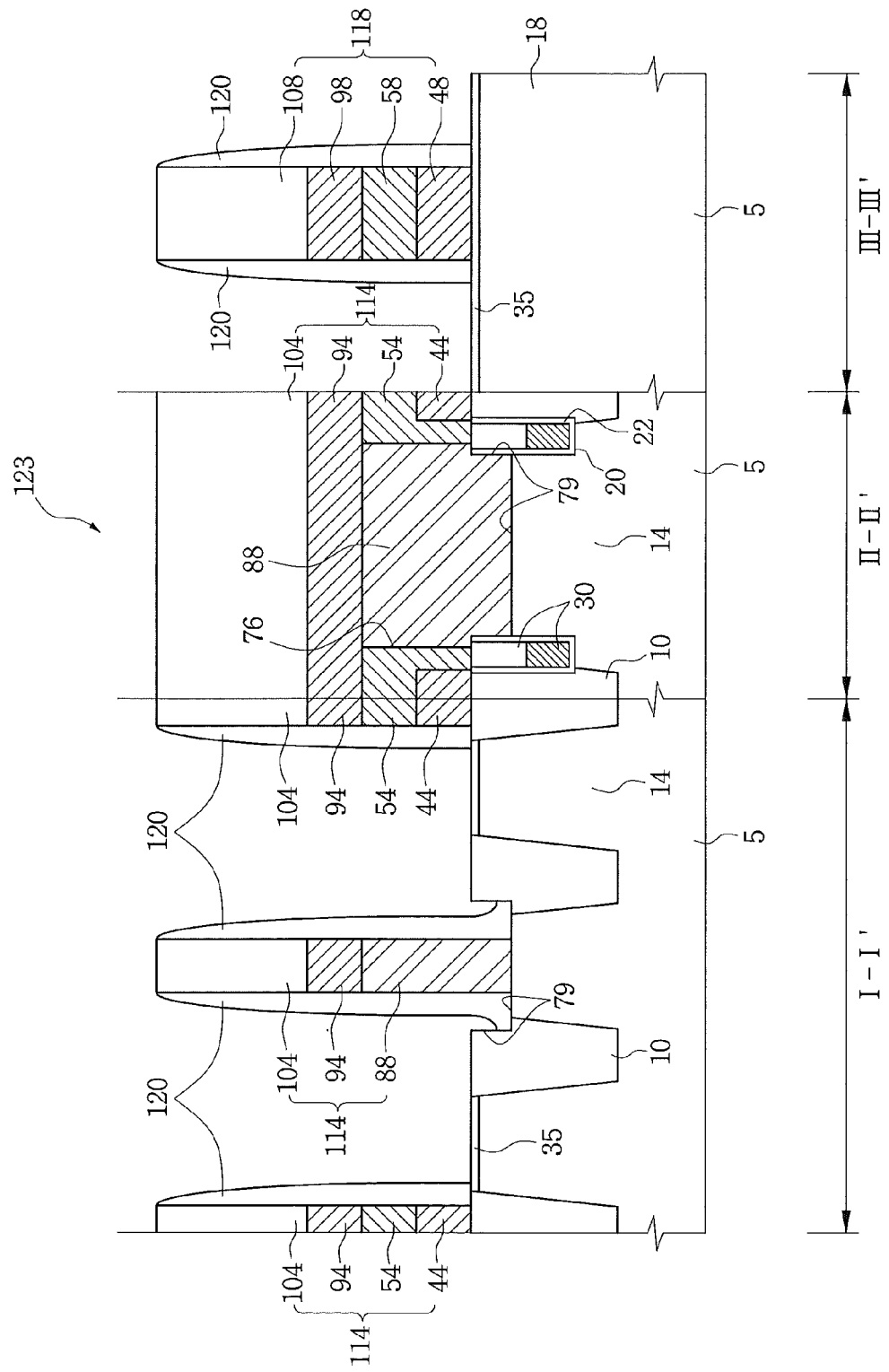

Referring to FIG. 7, according to example embodiments, the first preliminary conductive patterns 40, the second conductive layer 50, the third preliminary conductive patterns 84, the fourth conductive layer 90, and the third insulating layer 100 may be etched in the cell array region C and the preliminary circuit region P. In this case, the first preliminary conductive patterns 40 may be formed into first cell conductive patterns 44 in the cell array region C, and a first peripheral conductive pattern 48 in the peripheral circuit region P. The second conductive layer 50 may be formed into second cell conductive patterns 54 in the cell array region C, and a second peripheral conductive pattern 58 in the peripheral circuit region P.

The third preliminary conductive patterns 84 may be formed into third cell conductive patterns 88 in the cell array region C. The fourth conductive layer 90 may be formed into fourth conductive patterns 94 in the cell array region C, and a fourth peripheral conductive pattern 98 in the peripheral circuit region P. The third insulating layer 100 may be formed into cell mask patterns 104 in the cell array region C, and a peripheral mask pattern 108 in the peripheral circuit region P. The first to fourth conductive patterns 44, 54, 88 and 94, and the cell mask patterns 104 may constitute second circuit interconnections 114 in the cell array region C.

In the cell array region C, concaves 79 or recessed regions 79 may be formed in the inactive region 10 and the cell active regions 14. The concaves 79 may be lower portions of the contact holes 76 of FIG. 6. The concaves 79 may expose the inactive region 10, the cell active regions 14, and the pad layer 35 along with the second circuit interconnections 114. The concaves 79 may be defined by the inactive region 10, the cell active regions 14, the interconnection insulating layer 22, and the first circuit interconnections 30. The second circuit interconnections 114 may cross over the cell active regions 14 as shown in FIG. 1, thereby partially exposing the concaves 79.

In this case, the first and second cell conductive patterns 44 and 54 may be located on the periphery of the concaves 79 in the second circuit interconnections 114. The second cell conductive patterns 54 may cover a portion of sidewalls of the first cell conductive patterns 44 in a length direction of the second circuit interconnections 114, and may expose the rest of the sidewalls of the first cell conductive patterns 44 through sidewalls of the second circuit interconnections 114. The third cell conductive patterns 88 may cut the first and second conductive patterns 44 and 54 in the concaves 79 in the length direction of the second circuit interconnections 114.

The first and second peripheral conductive patterns 48 and 58, the fourth peripheral conductive pattern 98, and the peripheral mask pattern 108 may constitute third circuit interconnections 118 in the peripheral circuit region P. Sidewall spacers 120 may be formed on sidewalls of the second circuit interconnections 114 and the third circuit interconnections 118. The sidewall spacers 120 may partially or completely fill the concaves 79. The sidewall spacer 120 may be formed of an insulating material having an etch rate equal to or different from the third insulating layer 100 of FIG. 6.

Consequently, the sidewall spacers 120, the semiconductor substrate 5, the first circuit interconnections 30, the second circuit interconnections 114, and the third circuit interconnection 118 can constitute semiconductor interconnection structures 123.

Figure 8:
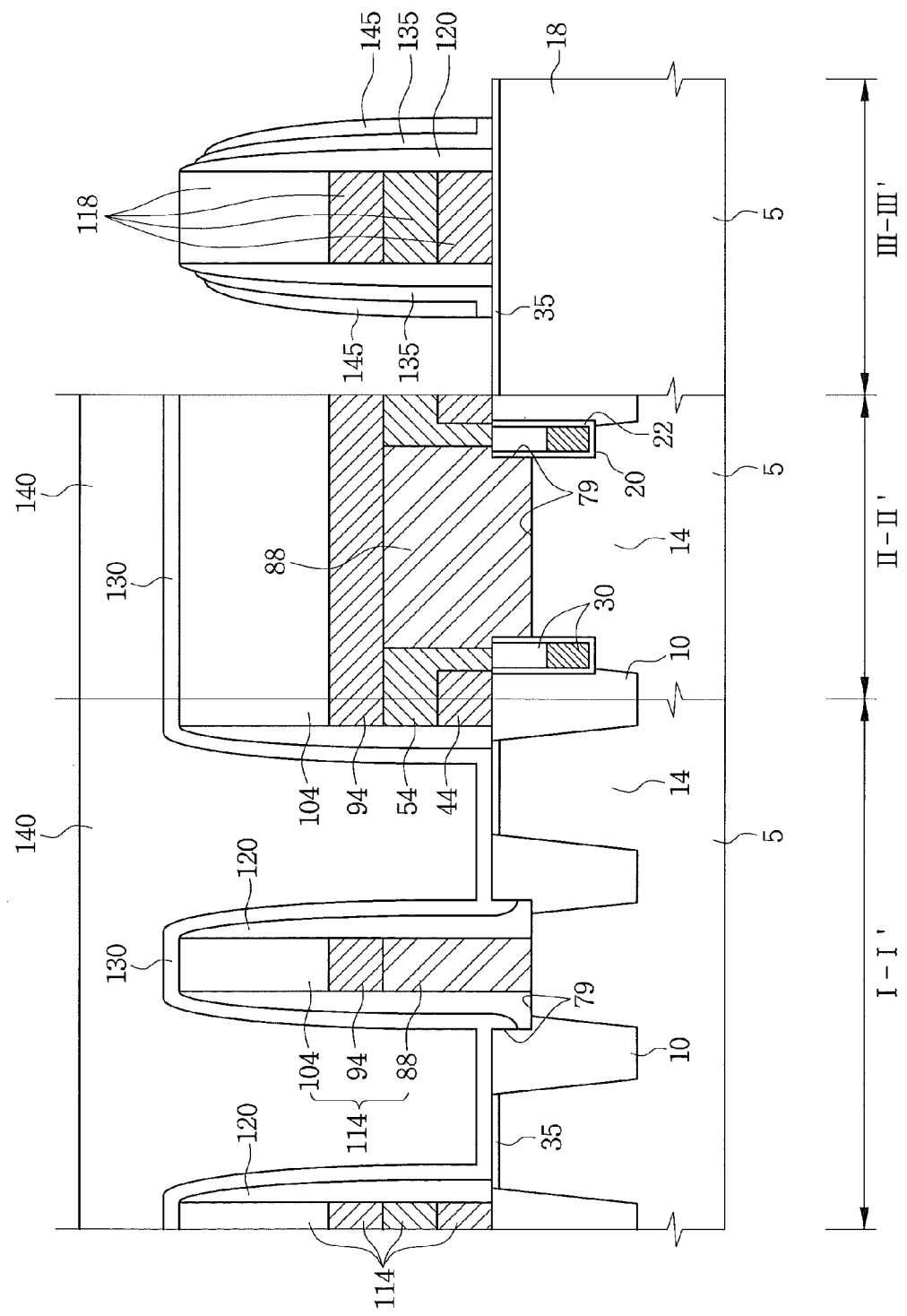

Referring to FIG. 8, according to example embodiments, a first etch stop layer 130 may be formed in the cell array region C and the peripheral circuit region P. The first etch stop layer 130 may conformally cover the inactive region 10, the cell active regions 14, the at least one peripheral active region 18, the second and third circuit interconnections 114 and 118, and the sidewall spacers 120. The first etch stop layer 130 may be formed of an insulating material having an etch rate equal to or different from the sidewall spacer 120. A sacrificial layer 140 may be formed on the first etch stop layer 130. The sacrificial layer 140 may completely fill regions between the second circuit interconnections 114 in the cell array region C.

The sacrificial layer 140 may conformally cover the first etch stop layer 130 in the peripheral circuit region P. The sacrificial layer 140 may be formed of an insulating material having an etch rate equal to or different from the first etch stop layer 130. The first etch stop layer 130 and the sacrificial layer 140 in the peripheral circuit region P may be etched to expose the at least one peripheral active region 18 using sacrificial layer 140 in the cell array region C as an etch buffer layer. The first etch stop layer 130 may be formed into first peripheral spacers 135 in the peripheral circuit region P. The sacrificial layer 140 may be formed into second peripheral spacers 145 in the peripheral circuit region P. The second peripheral spacers 145 may cover the first peripheral spacers 135.

Figure 9:
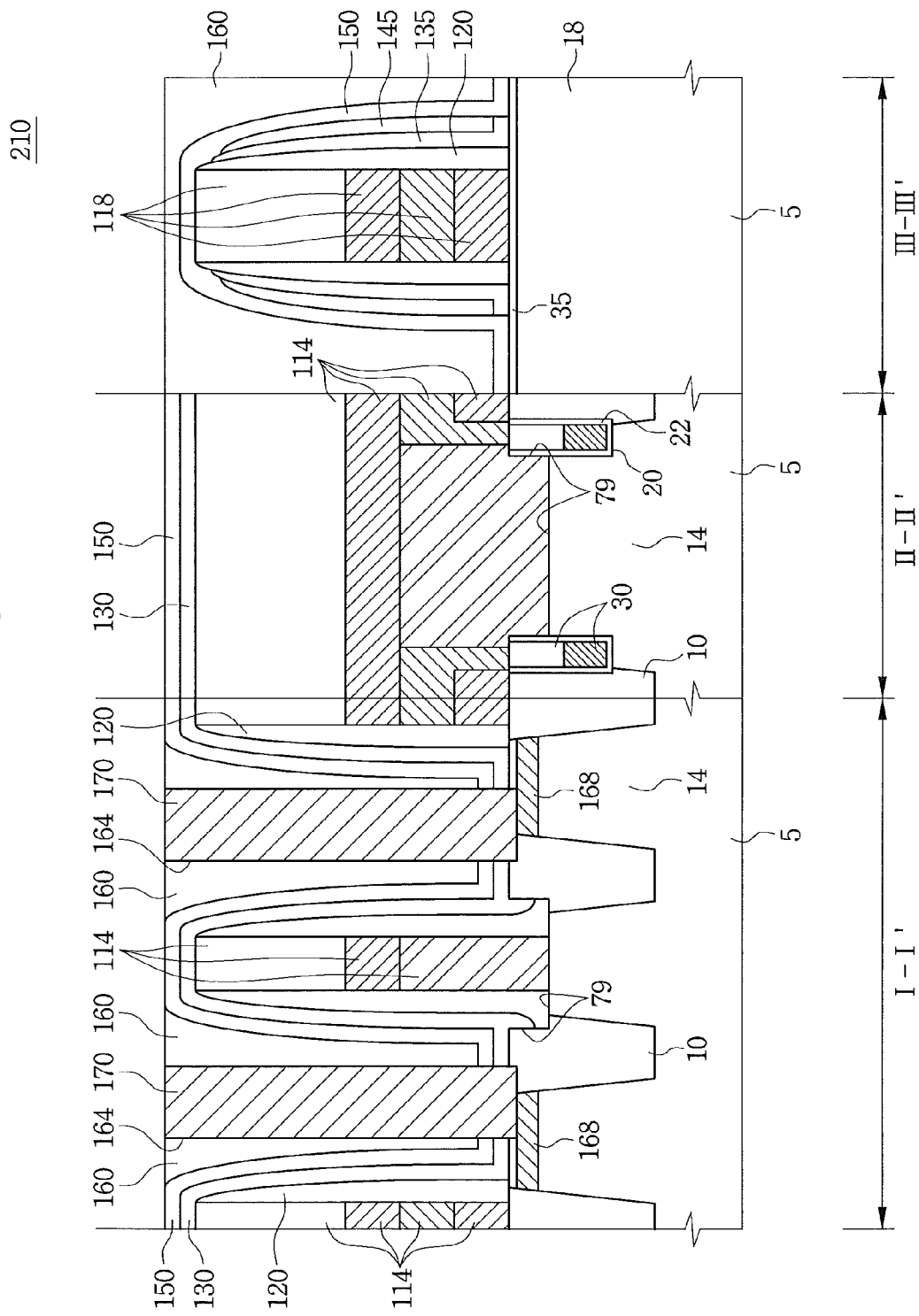

Referring to FIG. 9, according to example embodiments, a photoresist layer (not shown) may be formed in the peripheral circuit region P. The photoresist layer may cover the at least one peripheral active region 18, the third circuit interconnection 118, the sidewall spacers 120, and the first and second peripheral spacers 135 and 145. The sacrificial layer 140 may be removed from the cell array region C of the semiconductor substrate 5 using the photoresist layer as an etch mask and/or etch buffer layer. A second etch stop layer 150 may be formed on the at least one peripheral active region 18, the third circuit interconnection 118, the first etch stop layer 130, and the first and second peripheral spacers 135 and 145. The second etch stop layer 150 may be formed of an insulating material having an etch rate equal to or different from the first etch stop layer 130. A buried layer 160 may be formed on the second etch stop layer 150. The buried layer 160 may expose the second etch stop layer 150 in the cell array region C and/or the peripheral circuit region P. The buried layer 160 may be formed of an insulating material having an etch rate equal to or different from the second etch stop layer 150. Through holes 164 may be formed in the pad layer 35, the first and second etch stop layers 130 and 150, and the buried layer 160. The through holes 164 may be disposed between the second circuit interconnections 114 through the buried layer 160.

The through holes 164 may expose the inactive region 10 and the cell active regions 14. The through holes 164 may also expose only the cell active regions 14. Impurity diffusion regions 168 may be formed in the cell active regions 14 through the through holes 164 using the buried layer 160 as an ion implantation mask. The impurity diffusion regions 168 may include impurities having a conductivity equal to or different from the semiconductor substrate 5. Plugs 170 filling the through holes 164 may be formed.

The plugs 170 may be in contact with the impurity diffusion regions 168. The plugs 170 may be formed of a conductive material having a conductivity equal to or different from the impurity diffusion regions 168. Consequently, the plugs 170, and the first through third circuit interconnections 30, 114, and 118 can constitute a semiconductor device 210 according to the example embodiments.

Figure 10:
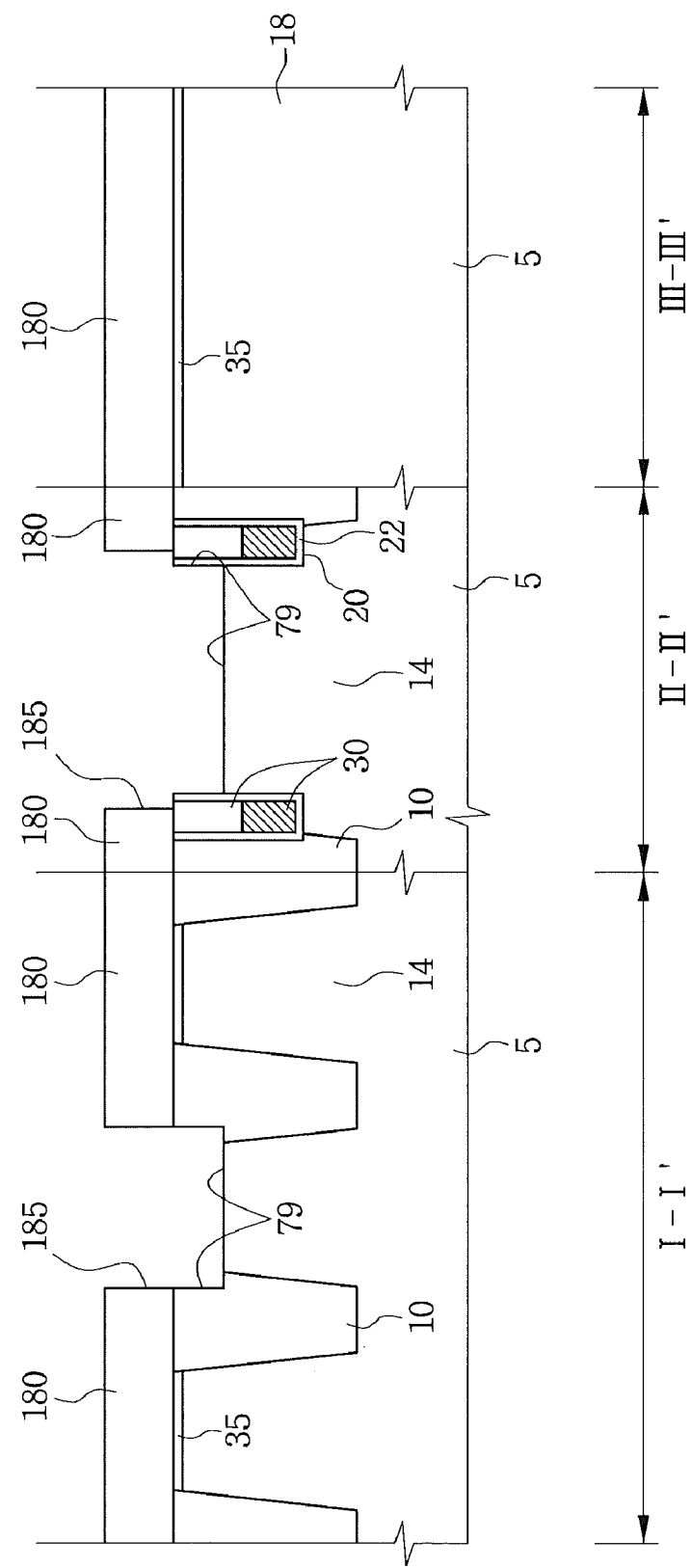
FIGS. 10 and 11 are cross-sectional views illustrating a method of fabricating a semiconductor device taken along lines I-I', II-II', and III-III' of FIG. 1.
Figure 11:
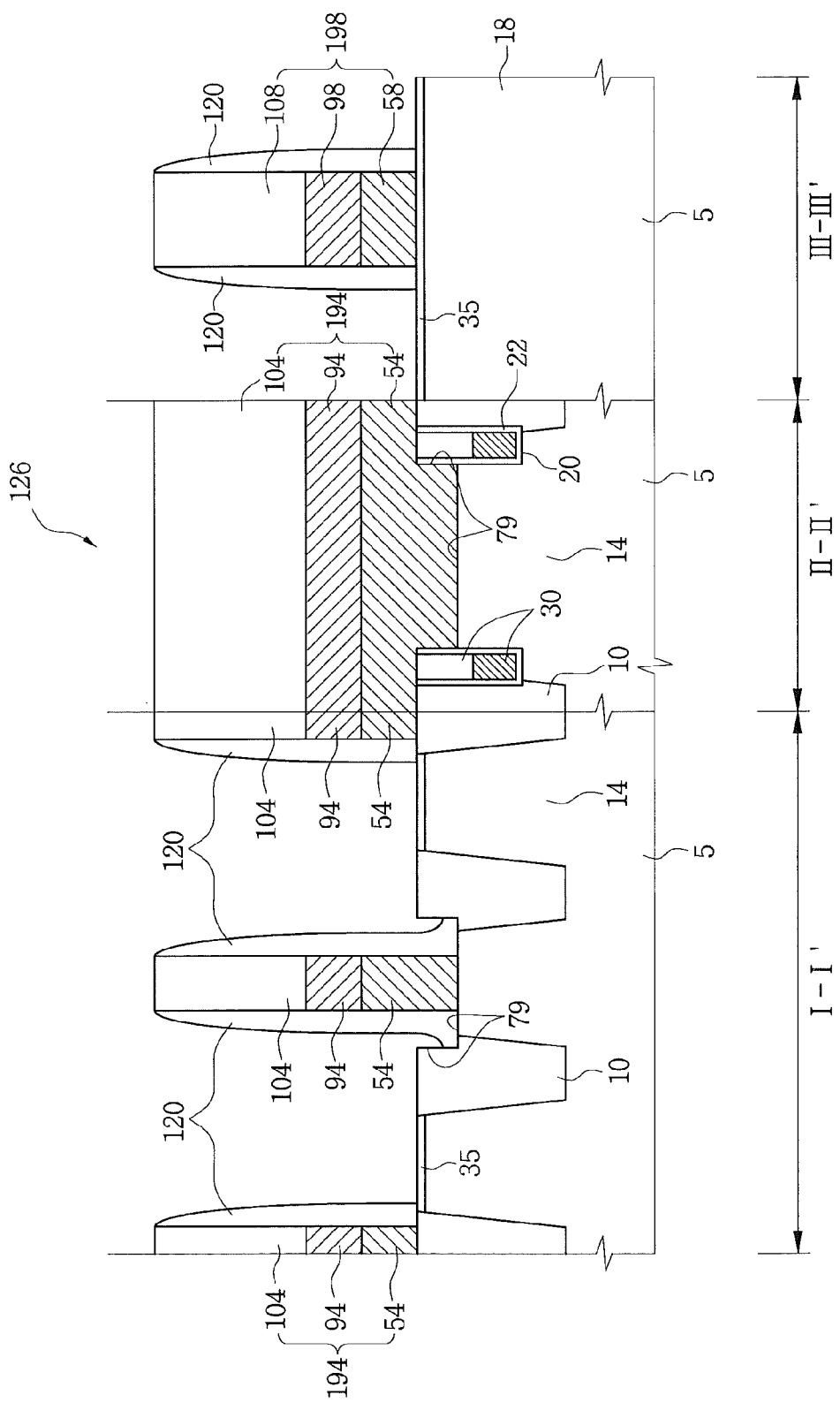

FIGS. 10 and 11 are cross-sectional views illustrating a method of fabricating a semiconductor device taken along lines I-I', II-II', and III-III' of FIG. 1. FIGS. 10 and 11 will use like reference numerals with respect to the same elements as FIGS. 3 through 9. Referring to FIG. 10, according to example embodiments, a semiconductor substrate 5 of FIG. 3 may be prepared. The semiconductor substrate 5 may include an inactive region 10, cell active regions 14, at least one peripheral active region 18, an interconnection insulating layer 22, first circuit interconnections 30, and a pad layer 35. A mask layer 180 may be formed in the cell array region C and the peripheral circuit region P of the semiconductor substrate 5. The mask layer 180 may be formed of an insulating material having an etch rate equal to or different from an isolation layer in the inactive region 10, the interconnection insulating layer 22, capping patterns 28 of the first circuit interconnections 30, and the pad layer 35.

Openings 185 may be formed in the mask layer 180. The openings 185 may expose the inactive region 10, the cell active regions 14, the interconnection insulating layer 22, the first circuit interconnections 30, and the pad layer 35. The inactive region 10, the cell active regions 14, and the pad layer 35 may be etched through the openings 185 using the mask layer 180 as an etch mask. In this case, concaves 79 may be formed in the inactive region 10 and the cell active regions 14. The concaves 79 may vertically extend from top surfaces of the inactive region 10 and the cell active regions 14 to a lower portion of the semiconductor substrate 5. The concaves 79 may be defined by the inactive region 10, the cell active regions 14, the interconnection insulating layer 22, and the first circuit interconnection 30. The concaves 29 may partially expose the first circuit interconnections 30.

Referring to FIG. 11, according to example embodiments, the mask layer 180 may be removed from the semiconductor substrate 5. The second conductive layer 50 of FIG. 4, and the fourth conductive layer 90 and the third insulating layer 100 of FIG. 6 may be sequentially formed on the inactive region 10 and the cell active regions 14. The second conductive layer 50 may be formed in the cell array region C and the peripheral circuit region P to fill the concaves 79. The fourth conductive layer 90 and the third insulating layer 100 may be formed in the cell array region C and the peripheral circuit region P to cover the second conductive layer 50.

At least one conductive layer may be formed between the second conductive layer 50 and the fourth conductive layer 90. The at least one conductive layer may be formed of a conductive material having an etch rate equal to or different from the second conductive layer 50 and/or the fourth conductive layer 90. The second conductive layer 50, the fourth conductive layer 90, and the third insulating layer 100 may be etched. The second conductive layer 50 may be formed into second cell conductive patterns 54 in the cell array region C, and a second peripheral conductive pattern 58 in the peripheral circuit region P. The fourth conductive layer 90 may be formed into fourth cell conductive patterns 94 in the cell array region C, and a fourth peripheral conductive pattern 98 in the peripheral circuit region P.

The third insulating layer 100 may be formed into cell mask patterns 104 in the cell array region C, and a peripheral mask pattern 108 in the peripheral circuit region P. The second cell conductive patterns 54, the fourth cell conductive patterns 94, and the cell mask patterns 104 may constitute second circuit interconnections 194 in the cell array region C. When at least one conductive layer is formed between the second conductive layer 50 and the fourth conductive layer 90, the second circuit interconnections 194 may include at least one cell conductive pattern between the second and forth cell conductive patterns 54 and 94.

In this case, the second circuit interconnections 194 may be formed in upper portions of the inactive region 10 and the cell active regions 14 on the periphery of the concaves 79. The second circuit interconnections 194 may partially expose the concaves 79 therein. The second cell conductive patterns 54 in the second circuit interconnections 194 may be formed along the second circuit interconnections 194 without disconnection thereof. Thus, the second cell conductive patterns 54 may be in contact with the first circuit interconnections 30 and the concaves 79 in the cell active regions 14 and extend horizontally to the inactive region 10.

The second peripheral conductive pattern 58, the fourth peripheral conductive pattern 98, and the peripheral mask pattern 108 may constitute a third circuit interconnection 198 in the peripheral circuit region P. When at least one conductive layer is formed between the second conductive layer 50 and the fourth conductive layer 90, the third circuit interconnection 198 may include at least one peripheral conductive pattern between the second and fourth peripheral conductive patterns 58 and 98. Sidewall spacers 120 may be formed on sidewalls of the second and third circuit interconnections 194 and 198. The sidewall spacers 120 may partially or completely fill the concaves 79.

Accordingly, the sidewall spacers 120 together with the semiconductor substrate 5, the first circuit interconnections 30, the second circuit interconnections 194, and the third circuit interconnection 198 can constitute a semiconductor interconnection structure 126. After the formation of the sidewall spacers 120, the semiconductor manufacturing processes shown in FIGS. 8 and 9 may be performed on the sidewall spacers 120, the second circuit interconnections 194, and the third circuit interconnection 198.

Figure 12:
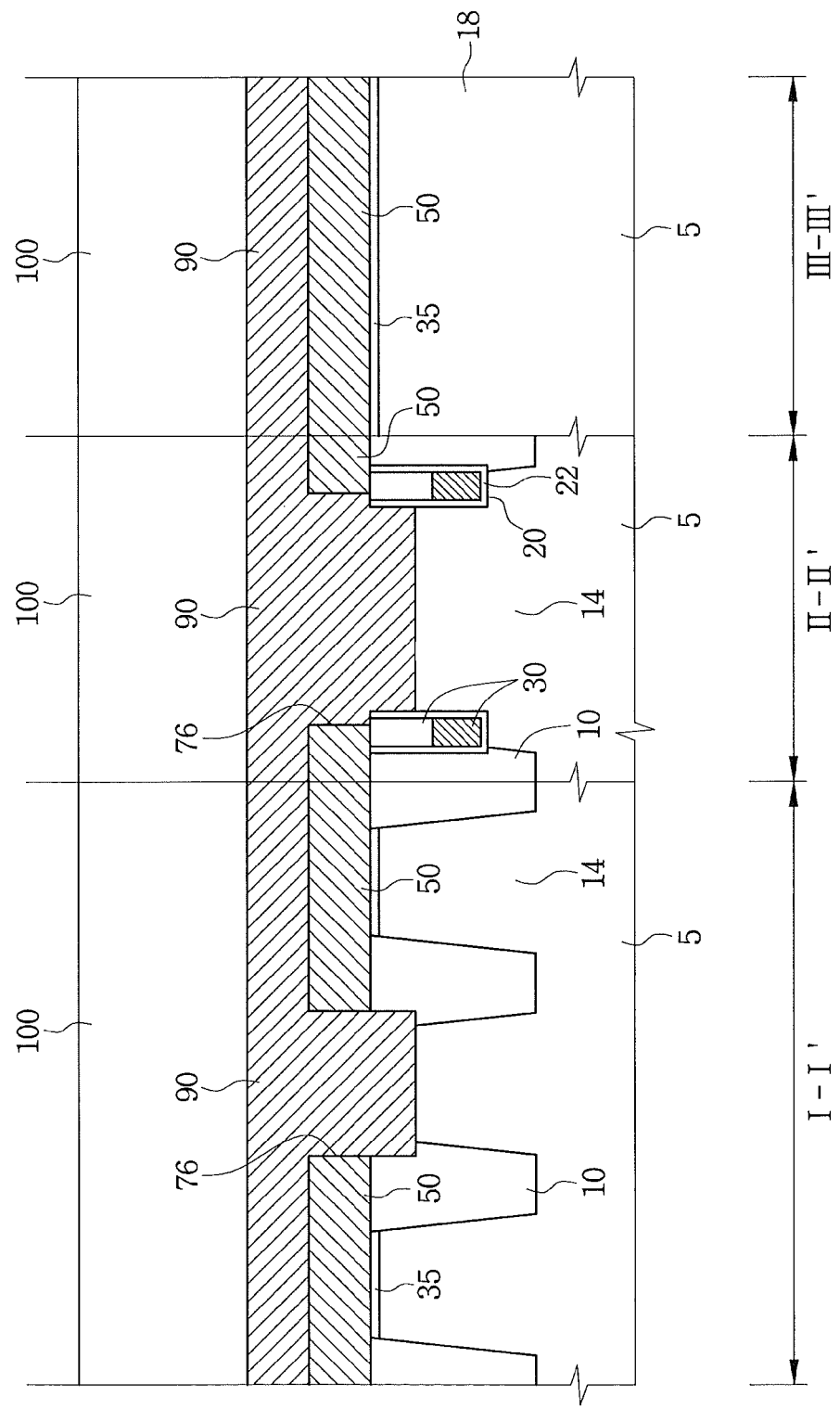
FIGS. 12 and 13 are cross-sectional views illustrating a method of fabricating a semiconductor device taken along lines I-I', II-II', and III-III' of FIG. 1.
Figure 13:
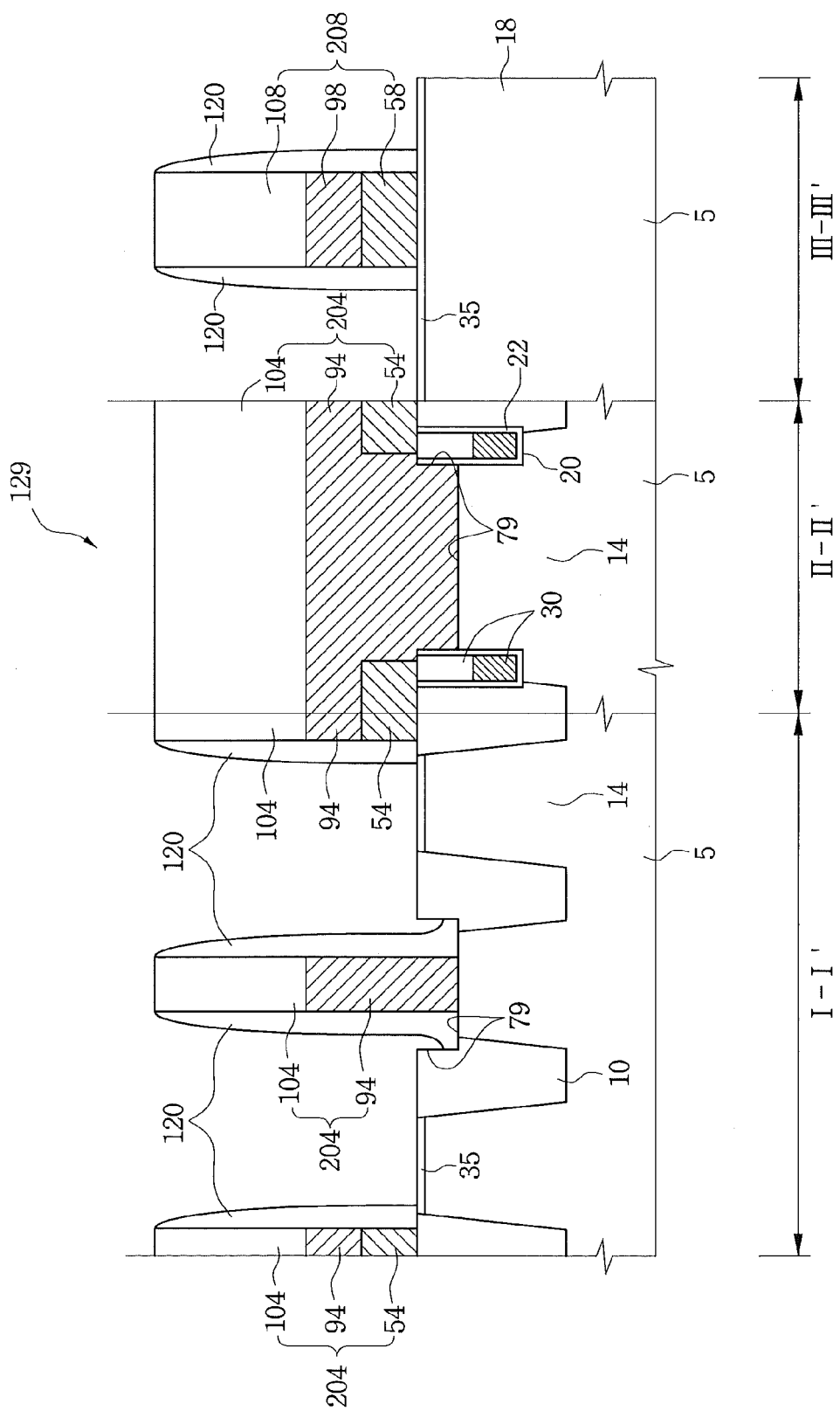

FIGS. 12 and 13 are cross-sectional views illustrating a method of fabricating a semiconductor device taken along lines I-I', II-II', and III-III' of FIG. 1. FIGS. 12 and 13 will use like reference numerals with respect to the same elements as FIGS. 3 through 9.

Referring to FIG. 12, according to example embodiments, a semiconductor substrate 5 of FIG. 3 may be prepared. The semiconductor substrate 5 may include an inactive region 10, cell active regions 14, at least one peripheral active region 18, first circuit interconnections 30, and a pad layer 35. A second conductive layer 50 may be formed in a cell array region C and a peripheral circuit region P of the semiconductor substrate 5. A photoresist layer (not shown) may be formed on the second conductive layer 50. Openings may be formed in the photoresist layer. The openings may expose the second conductive layer 50 in the cell array region C.

The inactive region 10, the cell active regions 14, the pad layer 35, and the second conductive layer 50 may be etched through the openings using the photoresist layer as an etch mask. In this case, the inactive region 10, the cell active regions 14, and the second conductive layer may have contact holes 76 aligned with the openings. The contact holes 76 may expose the first circuit interconnections 30. After the formation of the contact holes 76, the photoresist layer may be removed from the semiconductor substrate 5. A fourth conductive layer 90 may be formed on the first circuit interconnections 30 and the second conductive layer 50 to cover the contact holes 76.

The fourth conductive layer 90 may be formed in the cell array region C and the peripheral circuit region P. Before the fourth conductive layer 90 is formed, third preliminary conductive patterns 84 of FIG. 6 exposing the second conductive layer 50 and filling the contact holes 76 may be formed. A fourth conductive layer 90 may be formed on the second conductive layer 50 and the third preliminary conductive patterns 84. Before the fourth conductive layer 90 is formed, at least one conductive layer may also be formed on the second conductive layer 50 to conformally cover the contact holes 76.

The at least one conductive layer may be disposed in the cell array region C and the peripheral circuit region P. The at least one conductive layer may be formed of a conductive material having and etch rate equal to or different from the second conductive layer 50 and/or the fourth conductive layer 90. Subsequently, a third insulating layer 100 may be formed on the fourth conductive layer 90. The third insulating layer 100 may be formed in the cell array region C and the peripheral circuit region P.

Referring to FIG. 13, according to example embodiments, the second conductive layer 50, the fourth conductive layer 90, and the third insulating layer 100 of FIG. 12 may be etched. The second conductive layer 50 may be formed into second cell conductive patterns 54 in the cell array region C, and a second peripheral conductive pattern 58 in the peripheral circuit region P. The fourth conductive layer 90 may be formed into fourth cell conductive patterns 94 in the cell array region C, and a fourth peripheral conductive pattern 98 in the peripheral circuit region P. The third insulating layer 100 may be formed into cell mask patterns 104 in the cell array region C, and a peripheral mask pattern 108 in the peripheral circuit region P. The second cell conductive patterns 54, the fourth cell conductive patterns 94, and the cell mask patterns 104 may constitute second circuit interconnections 204 in the cell array region C. The second circuit interconnections 204 may be formed in upper portions of the inactive regions 10 and the cell active region 14. Along with the second circuit interconnections 204, the cell array region C may include concaves 79 in the inactive region 10 and the cell active regions 14. The concaves 79 may be defined by the inactive region 10, the cell active regions 14, the interconnection insulating layer 22, and the first circuit interconnection 30. The second circuit interconnections 204 may partially expose the concaves 79.

The second cell conductive patterns 54 may be disconnected at the concaves 79 in a length direction of the second circuit interconnections 204. The second conductive patterns 54 may be located on the periphery of the concaves 79 along the length direction of the second circuit interconnections 204. The fourth cell conductive patterns 94 may be located along the length direction of the second circuit interconnections 204 to fill the concaves 79 and cover the first circuit interconnections 30 and the second conductive patterns 54. When the contact holes 76 of FIG. 12 are filled with the third preliminary conductive patterns 84 of FIG. 6, the second circuit interconnection 204 may have a structure in which the first conductive patterns 44 are removed from the second circuit interconnections 114 of FIG. 7.

When at least one conductive layer is formed under the fourth conductive layer 90 and on the contact holes 76 and the second conductive layer 50, the second circuit interconnections 204 may have at least one cell conductive pattern between the concave 79 and the fourth cell conductive pattern 94 and between the second and fourth cell conductive patterns 54 and 94. The second peripheral conductive pattern 58, the fourth peripheral conductive pattern 98, and the peripheral mask pattern 108 may constitute a third circuit interconnection 208. When at least one conductive layer is formed under the fourth conductive layer 90 and on the contact holes 76 and the second conductive layer 50, the third circuit interconnection 208 may have at least one peripheral conductive pattern between the second and fourth peripheral conductive patterns 58 and 98.

Sidewall spacers 120 may be formed on sidewalls of the second and third circuit interconnections 204 and 208. The sidewall spacers 120 may partially or completely fill the concaves 79. Accordingly, the sidewall spacers 120 together with the semiconductor substrate 5, the first circuit interconnections 30, the second circuit interconnections 204, and the third circuit interconnection 208 may constitute a semiconductor interconnection structure 129. After the formation of the sidewall spacers 120, the semiconductor fabrication processes shown in FIGS. 8 and 9 may be performed on the sidewall spacers 120, the second circuit interconnections 204, and the third circuit interconnection 208.

Figure 14:
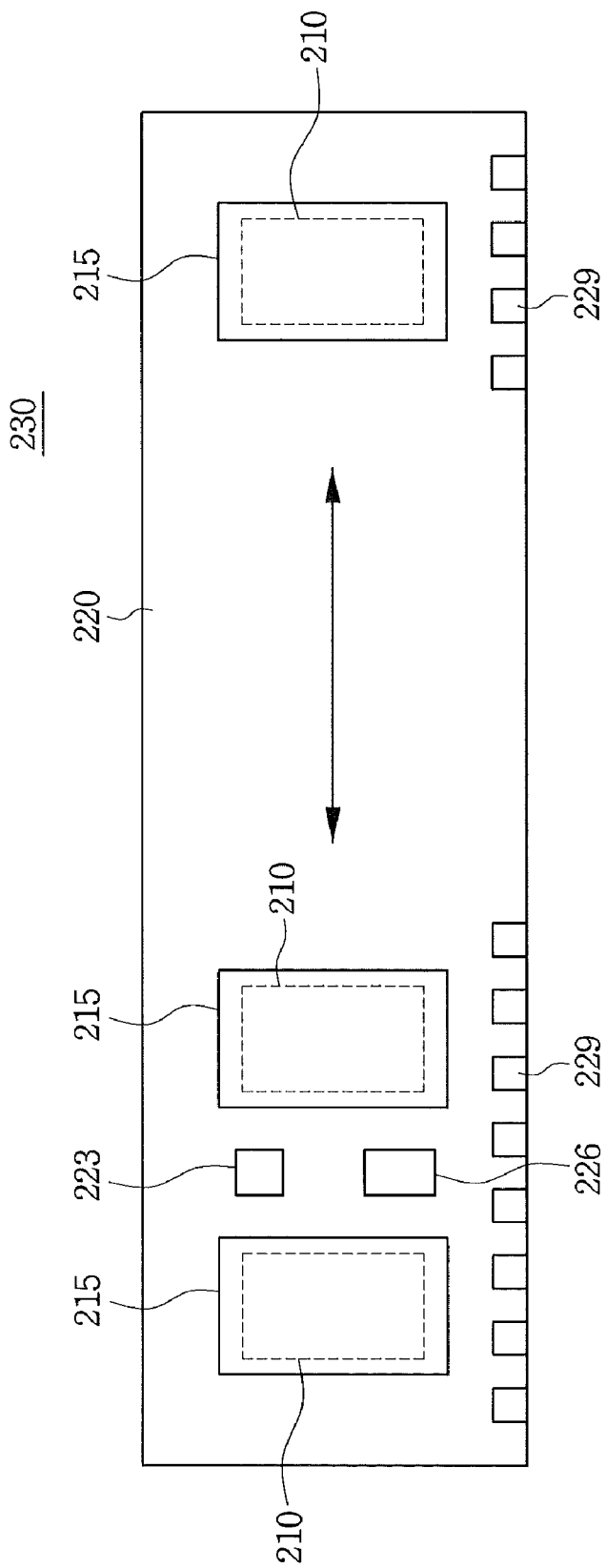
FIG. 14 is a plan view showing a semiconductor module including the semiconductor device of FIG. 1.

FIG. 14 is a plan view showing a semiconductor module including the semiconductor device of FIG. 1. Referring to FIG. 14, a semiconductor module 230 according to example embodiments may include a module substrate 220. The module substrate 220 may be a printed circuit board, or a plate including an electric circuit. The module substrate 220 may include internal circuits (not shown), electric pads (not shown), and connectors 229. The internal circuits may be in electrical contact with the electric pads and the connectors 229. Semiconductor package structures 215 and at least one resistor 223 may be disposed on the module substrate 220.

Semiconductor package structures 215, at least one resistor 223, and at least one condenser 226 may be disposed on the module substrate 220. The semiconductor package structures 215, the at least one resistor 223, and the at least one condenser 226 may be in electrical contact with the electric pads. Each of the semiconductor package structures 215 may include a semiconductor device 210 at least one. The semiconductor device 20 may include a cell array region C and a peripheral circuit region P.

The cell array region C may have the cell active regions 14 of FIG. 1 along rows and columns of the semiconductor substrate 5 of FIG. 2. The cell active regions 14 may be repeatedly and periodically arrayed in the cell array region C along with the first circuit interconnection 30, the concaves 79, the second circuit interconnection 114, 194 or 204, and the through holes 164 of FIG. 1. The peripheral circuit region P may surround the cell array region C. The peripheral circuit region P may have peripheral circuits to be in electrical contact with the cell array region C.

The peripheral circuits may include the third circuit interconnection 118, 198 or 208 of FIG. 1. Accordingly, the cell array region C and the peripheral circuit region P may have a plurality of semiconductor interconnection structures 123, 126 or 129 shown in FIG. 7, 11 or 13. Accordingly, the semiconductor module 230 may have an improved electrical characteristic, compared to the conventional art. The semiconductor module 230 may be in electrical contact with a processor-based system 260 of FIG. 15 through the connectors 229 of the module substrate 220.

Figure 15:
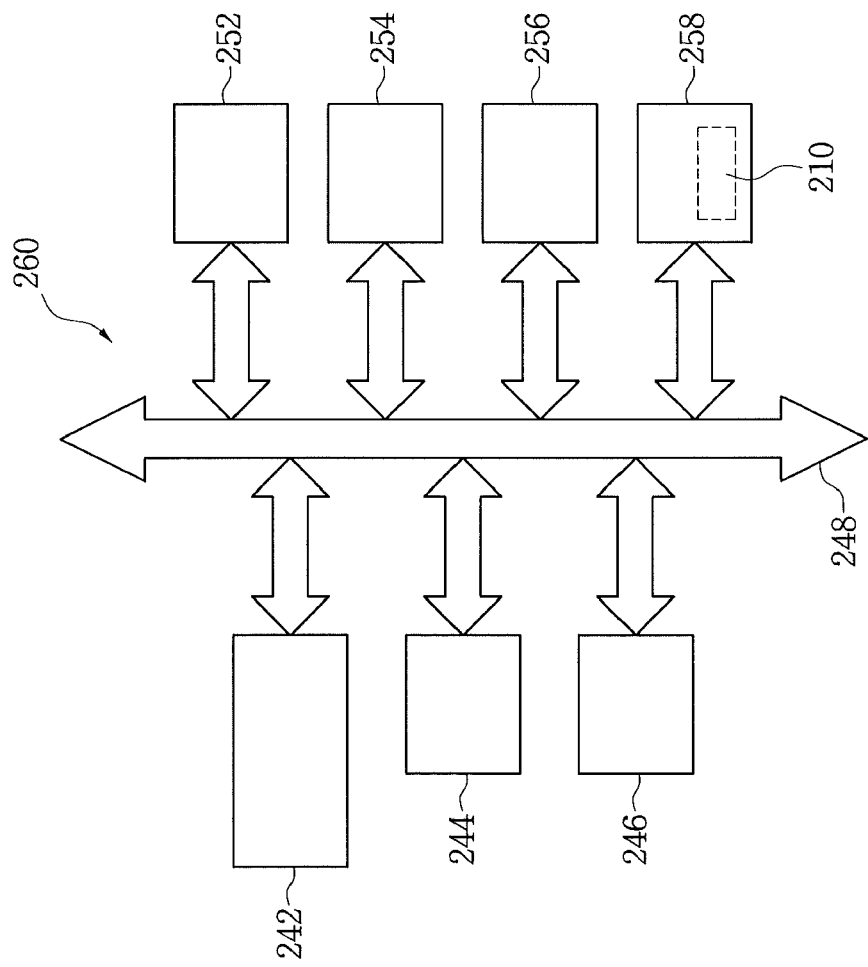
FIG. 15 is a plan view showing a processor-based system including the semiconductor device of FIG. 1.

FIG. 15 is a plan view showing a processor-based system according to example embodiments. Referring to FIG. 15, according to example embodiments, a processor-based system 260 may include at least one system board (not shown). The at least one system board may have at least one bus line 248. A first module unit may be disposed on the at least one bus line 248. The first module unit may be in electrical contact with the at least one bus line 248. The first module unit may be composed of a central processing unit (CPU) 242, a floppy disk drive 244, and a compact disk ROM drive 246.

A second module unit may be disposed on the at least one bus line 248. The second module unit may be in electrical contact with the at least one bus line 248. The second module unit may be composed of a first I/O device 252, a second I/O device 254, a read-only memory (ROM) 256, and a random access memory (RAM) 258.

The RAM 258 may include the semiconductor module 230 of FIG. 14, or independently include the semiconductor device 210 of FIG. 14 according to example embodiments. The ROM 256 may also include the semiconductor device 210 according to example embodiments. Accordingly, the processor-based system 260 can have an improved electrical characteristic, compared to the conventional art. The processor-based system 260 may include a computer system, a process control system, or another system.

As described above, example embodiments may provide a semiconductor interconnection structure suitable for preventing an electric short between a plug and a circuit interconnection using a concave. In this case, the concave may be defined to be located under the circuit interconnection in a semiconductor substrate. Example embodiments may also provide a semiconductor interconnection structure suitable for preventing a physical contact between a plug and a circuit interconnection by disposing a sidewall spacer between the plug and the circuit interconnection. The sidewall spacer is located on a sidewall of the circuit interconnection, and can at least partially fill the concave.

The semiconductor interconnection structure may be disposed in a semiconductor device fabricated by processing the semiconductor substrate. The semiconductor device may include a volatile memory and/or non-volatile memory. The semiconductor device can have an improved electrical characteristic compared to the conventional art by using the semiconductor interconnection structure. The semiconductor device may be located in a semiconductor module and/or a processor-based system. The semiconductor module and/or the processor-based system can improve an electrical characteristic compared to the conventional art by using the semiconductor device including the semiconductor interconnection structure.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
    a semiconductor substrate having a plurality of trench isolation regions therein that define respective semiconductor active regions therebetween;
    a trench in the semiconductor substrate, the trench having first and second opposing sidewalls that define interfaces with a first trench isolation region and a first active region, respectively;
    a first electrical interconnect at a bottom of the trench;
    an electrically insulating capping pattern extending between the first electrical interconnect and a top of the trench;
    an interconnect insulating layer lining the first and second sidewalls and the bottom of the trench, the interconnect insulating layer extending between the first electrical interconnect and the first active region;
    a recess in the first active region, the recess having a sidewall that defines an interface with the interconnect insulating layer; and
    a second electrical interconnect extending on an upper surface of the first trench isolation region, the electrically insulating capping pattern and the sidewall of the recess.

2. The device according to claim 1, wherein the first and second electrical interconnects extend across the semiconductor substrate in first and second directions, respectively; and wherein the first and second directions are orthogonal to each other.

3. The device according to claim 2, wherein the second electrical interconnect fills the recess.

4. The device according to claim 3, wherein the trench exposes the first trench isolation region and the first active region.

5. The device according to claim 4, wherein a bottom surface of the trench is a lower level than that of the recess.

6. A semiconductor device, comprising:
    a semiconductor substrate having at least one recessed region;
    a first circuit interconnection located at an edge of the at least one recessed region and extending from a top surface of the semiconductor substrate to a lower portion of the semiconductor substrate; and
    a second circuit interconnection located on the semiconductor substrate, crossing the first circuit interconnection, and including a first conductive pattern disposed on a periphery of the at least one recessed region, a second conductive pattern disposed in the at least one recessed region, and mask patterns disposed on the first and second conductive patterns,
    wherein a level of a bottom surface of the second conductive pattern of the second circuit interconnection is lower than a level of the top surface of the semiconductor substrate.

7. The device according to claim 6, wherein the top surface of the semiconductor substrate is located at substantially the same level as a top surface of the first circuit interconnection, and a bottom surface of the at least one recessed region is located between the top surface and a bottom surface of the first circuit interconnection.

8. The device according to claim 7, further comprising a third conductive pattern disposed in the second circuit interconnection, wherein the first conductive pattern is formed of the same material as the second conductive pattern, the first and second conductive patterns being in contact with each other and covering the at least one recessed region and the first circuit interconnection, and the third conductive pattern is formed of a different material from the second conductive pattern between the first conductive pattern, the second conductive pattern, and the mask pattern.

9. The device according to claim 7, further comprising a third conductive pattern disposed in the second circuit interconnection, wherein the first conductive pattern extends from the semiconductor substrate to the first circuit interconnection and is formed of a different material from the second conductive pattern, the second conductive pattern extends from the at least one recessed region to the first conductive pattern to cover the first conductive pattern, and the third conductive pattern is formed of the same material as the second conductive pattern between the second conductive pattern and the mask pattern.

10. The device according to claim 7, further comprising a third conductive pattern disposed in the second circuit interconnection,
    wherein the first conductive pattern includes a lower conductive pattern and an upper conductive pattern, which are sequentially stacked, the lower and upper conductive patterns being formed of the same material having the same impurity concentration or different impurity concentrations, and the upper conductive pattern extending from the lower conductive pattern to the first circuit interconnection and covering the lower conductive pattern, and
    the second conductive pattern is formed of the same material as or a different material from the upper conductive pattern, extends from the at least one recessed region to the first circuit interconnection and is in contact with the upper conductive pattern, and the third conductive pattern is formed of a different material from the upper conductive pattern and the second conductive pattern, and disposed between the first conductive pattern, the second conductive pattern, and the mask pattern.

11. A semiconductor device, comprising:
a semiconductor substrate having a concave in an active region and an inactive region;
a first circuit interconnection exposed to the concave and extending from top surfaces of the active region and the inactive region to a lower portion of the semiconductor substrate;
a second circuit interconnection crossing the active region, the inactive region and the first circuit interconnection, and including a first conductive pattern disposed on a periphery of the concave, a second conductive pattern located in the concave and exposing the concave, and a mask pattern disposed on the first and second conductive patterns;
a plug spaced apart from the concave and disposed on the periphery of the first and second circuit interconnections; and
a sidewall spacer located on a sidewall of the second circuit interconnection facing the plug and covering the concave.

12. The device according to claim 11, wherein the top surfaces of the active region and the inactive region are located at the same level as a top surface of the first circuit interconnection, the first circuit interconnection has an interconnection and a capping pattern, which are sequentially stacked, and a bottom surface of the concave is located between top and bottom surfaces of the capping pattern.

13. The device according to claim 12, further comprising a third conductive pattern disposed in the second circuit interconnection,
wherein the first to third conductive patterns and the mask pattern are in contact with the sidewall spacer, the first conductive pattern is formed of the same material as the second conductive pattern and in contact with the second conductive pattern, the first and second conductive patterns partially cover the inactive region, the active region and the first circuit interconnection, and the third conductive pattern is formed of a different material from the second conductive pattern and disposed between the first conductive pattern, the second conductive pattern and the mask pattern.

14. The device according to claim 13, wherein the first and second conductive patterns are configured in one body in the second circuit interconnection, and the plug is located on the active region between the first and second circuit interconnections.

15. The device according to claim 12, further comprising a third conductive pattern disposed in the second circuit interconnection,
wherein the first to third conductive patterns and the mask pattern are in contact with the sidewall spacer, the first conductive pattern is formed of a different material from the second conductive pattern and extending from the sidewall spacer to the first circuit interconnection, the second conductive pattern extends from the concave to the first conductive pattern to cover the first conductive pattern and partially covers the inactive region, the active region and the first circuit interconnection, and the third conductive pattern is formed of the same material as the second conductive pattern and disposed between the first conductive pattern, the second conductive pattern and the mask pattern.

16. The device according to claim 15, wherein the second and third conductive patterns are configured in one body in the second circuit interconnection, and the plug is located on the active region between the first and second circuit interconnections.

17. The device according to claim 12, further comprising a third conductive pattern disposed in the second circuit interconnection,
wherein the first to third conductive patterns and the mask pattern are in contact with the sidewall spacer, the first conductive pattern includes lower and upper conductive patterns, which are sequentially stacked, the lower conductive pattern being covered with the upper conductive pattern, the lower and upper conductive patterns being formed of the same material having the same impurity concentration or different impurity concentrations, and the upper conductive pattern extending from the lower conductive pattern to the first circuit interconnection,
the second conductive pattern is formed of the same material as or a different material from the upper conductive pattern, partially covers the inactive region, the active region and the first circuit interconnection, and is in contact with the upper conductive pattern, and
the third conductive pattern is formed of a different material from the upper conductive pattern and the second conductive pattern, and disposed between the first conductive pattern, the second conductive pattern, and the mask pattern.

18. The method according to claim 17, wherein a top surface of the first conductive pattern is located at substantially the same level as a top surface of the second conductive pattern.

19. The device according to claim 12, wherein the active region crosses the second circuit interconnection in a central region of the concave.

20. The device according to claim 19, wherein the first circuit interconnection crosses the active region and the second circuit interconnection at an edge of the concave.

* * * * *